(12) United States Patent  
He (10) Patent No.: US 8,846,475 B2  
(45) Date of Patent: Sep. 30, 2014

(54) METHOD FOR FABRICATING A SEMICONDUCTOR DEVICE

(71) Applicant: Semiconductor Manufacturing International (Shanghai) Corporation, Shanghai (CN)

(72) Inventor: Allan He, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 13/954,976

(22) Filed: Jul. 31, 2013

(65) Prior Publication Data

US 2014/0187006 A1    Jul. 3, 2014

(30) Foreign Application Priority Data

Dec. 31, 2012  (CN) .......................... 2012 1 0594284

(51) Int. Cl.  
*H01L 21/8234* (2006.01)

(52) U.S. Cl.  
CPC .............................. *H01L 21/823462* (2013.01)  
USPC .................. 438/275; 257/E21.434

(58) Field of Classification Search  
USPC .................. 438/221, 233, 976; 257/E21.434  
See application file for complete search history.

(56) References Cited

U.S. PATENT DOCUMENTS

| | | | | |
|---|---|---|---|---|
| 6,368,923 B1 * | 4/2002 | Huang | ........................... | 438/275 |
| 6,586,288 B2 * | 7/2003 | Kim et al. | ...................... | 438/183 |
| 8,021,942 B2 * | 9/2011 | Wei et al. | ...................... | 438/216 |
| 2008/0105910 A1 * | 5/2008 | Matsuki | ........................ | 257/295 |

* cited by examiner

*Primary Examiner* — Chandra Chaudhari  
(74) *Attorney, Agent, or Firm* — Kilpatrick Townsend and Stockton LLP (57) ABSTRACT

A method for fabricating a semiconductor device comprises providing a substrate having a core oxide layer and an I/O oxide layer formed thereon. The I/O oxide layer has an I/O mask layer formed thereon. The method also includes forming an I/O dummy gate on the I/O mask layer and a core dummy gate on the core oxide layer, forming an etch barrier layer on the substrate covering the dummy gates, forming a dielectric layer on the etch barrier layer, and planarizing the etch barrier layer and the dielectric layer to expose the top surface of the dummy gates. The method further includes simultaneously removing the I/O and core dummy gates to form I/O and core gate grooves, removing the core oxide layer, removing the I/O mask layer, depositing a dielectric layer in the core gate groove, and forming a metal gate layer filling the I/O and core gate grooves.

13 Claims, 9 Drawing Sheets

METHOD FOR FABRICATING A SEMICONDUCTOR DEVICE

CROSS-REFERENCES TO RELATED APPLICATIONS

This application claims the benefit of and priority to Chinese Patent Application No. CN201210594284.2, filed on Dec. 31, 2012, which is commonly owned and incorporated by reference herein for all purpose in its entirety.

FIELD OF THE INVENTION

The present application relates to the field of semiconductor, and more particularly to a method for fabricating metal gates in a semiconductor device.

BACKGROUND OF THE INVENTION

During a gate fabricating process of CMOS technology for 32 nm technology node or smaller, in order to optimize the performance of the semiconductor material fabricated, a semiconductor device fabricating method employs a gate-last processing technology and a high dielectric constant gate insulating dielectric (core gate dielectric) forming technology. This semiconductor device fabricating method which combines a gate-last processing technology and a high dielectric constant gate insulating dielectric (core gate dielectric) forming technology is capable of reducing the thickness of the oxide layer (EOT/Tinv), and thereby, improving technical ductility of the material. Moreover, this semiconductor device fabricating method which combines the gate-last process and a high dielectric constant gate insulating dielectric (core gate dielectric) can also improve the ability of the semiconductor material fabricated in withstanding a heat treatment process for a lightly doped drain region and source region.

FIGS. 1a to 1e illustrate a semiconductor device fabricating method which combines a gate-last processing technology and a high dielectric constant gate insulating dielectric (core gate dielectric) forming technology.

Figure 1A:
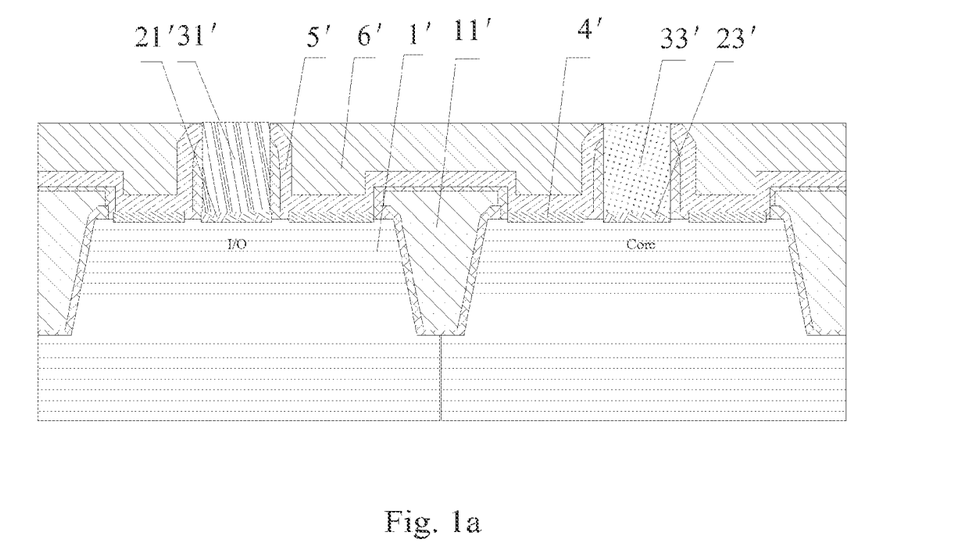
FIGS. 1a-1e are schematic diagrams of a cross section of a transition structure of a semiconductor device in various steps of an existing semiconductor device fabricating method.

As shown in FIG. 1a, a shallow trench isolation region STI 11' (STI: Shallow Trench Isolation) is formed in a surface of a substrate 1'. An oxide layer is deposited on the surface of the substrate, but not on the surface of the shallow trench isolation region 11'. A layer of dummy gate material is deposited on the oxide layer. A first photoresist layer is formed on an upper surface of the dummy gate material layer where a dummy gate structure is to be formed. The surface area of the dummy gate material layer that is not covered by the photoresist layer is removed to obtain the dummy gate structure. The dummy gate structure comprises an input/output (I/O) dummy gate 31' and a core dummy gate 33'. An oxide layer 2' located below the dummy gate material layer is further etched to form an input/output (I/O) oxide layer 21' located between the I/O dummy gate 31' and the substrate 1', and a core oxide layer 23' located between the core dummy gate 33' and the substrate 1'.

An LDD ion implant is performed in the substrate to form LDD doped regions on opposite sides of the I/O dummy gate 31' and the core dummy gate 33', a sidewall spacer structure is formed on the sidewall of the I/O dummy gate 31' and the core dummy gate 33', respectively. Thereafter, an ion implant is performed in the substrate on the two sides of the sidewall layer of the I/O dummy gate 31' and of the core dummy gate 33' to form a source region and a drain region on opposite sides of the I/O dummy gate 31' and the core dummy gate 33'.

An NiSi layer 4 is deposited on the surface of the substrate on which the I/O dummy gate 31', the core dummy gate 33' and the shallow trench isolation region 11' are not formed. An etch barrier layer 5' is formed on the side surface of the sidewall layer surrounding the I/O dummy gate 31' and the core dummy gate 33'. The etch barrier layer 5' extends along the sidewall of the I/O dummy gate 31' and of the core dummy gate 33', extends upwards to be flush with the upper surface of the dummy gate, and extends downwards continuously and covers the NiSi layer 4' and the shallow trench isolation region 11'.

Figure 1B:
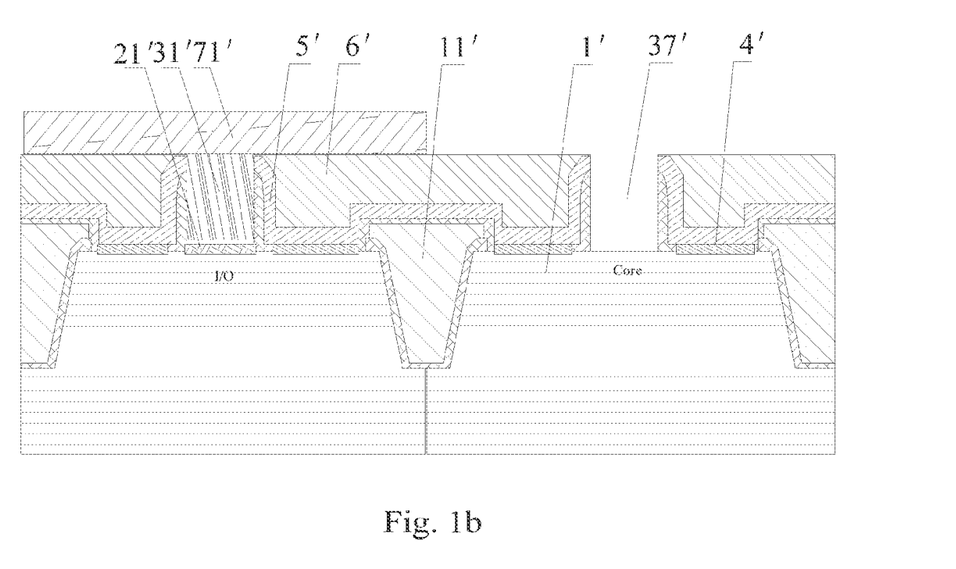

As shown in FIG. 1b, a second photoresist layer 71' is formed on the upper surface of the I/O dummy gate 31', the upper surface of the etch barrier layer 5' and the dielectric layer 6' surrounding the I/O dummy gate 31'. The core dummy gate 33' and the core oxide layer 23' are removed by etching, and a core gate groove 37' is formed at a location corresponding to the core dummy gate 33'. The second photoresist layer 71' on the upper surface of and surrounding the I/O dummy gate 31' is then removed.

Figure 1C:
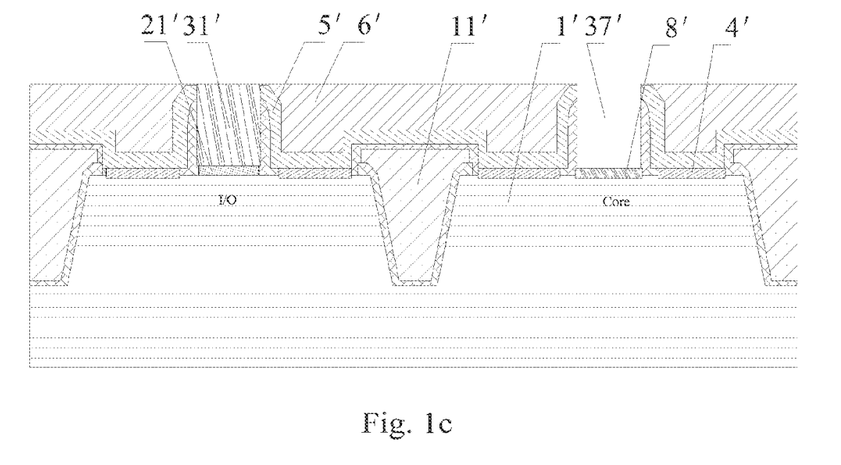

As shown in FIG. 1c, a core gate dielectric layer 8' is deposited on the substrate 1' in the core gate groove 37'.

Figure 1D:
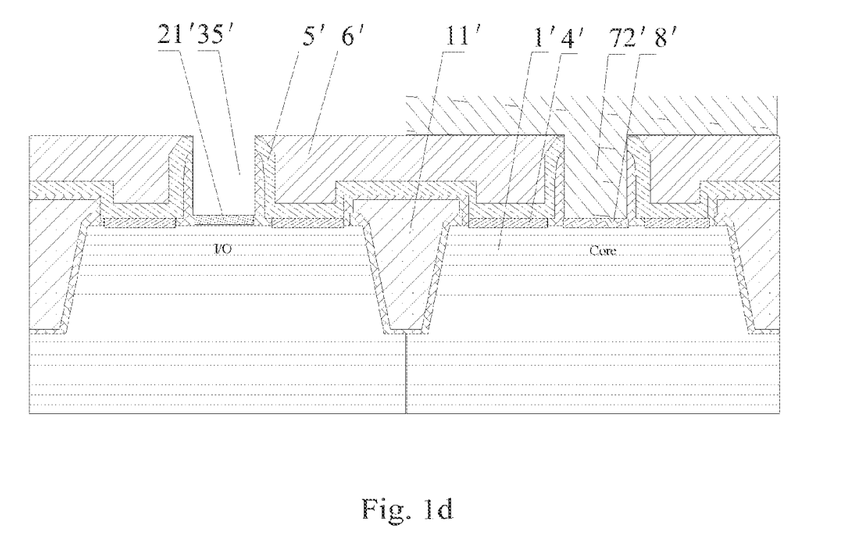

As shown in FIG. 1d, a third photoresist layer 72' is formed in the core gate groove 37' where the core gate dielectric layer 8' is formed, on the upper surface of the etch barrier layer 5' surrounding the core gate groove 37', and the upper surface of the dielectric layer 6', the I/O dummy gate 31' is removed by etching, and an input/output (I/O) gate groove 35' is formed at a location corresponding to the I/O dummy gate 31'. The third photoresist layer 72' within and surrounding the core gate groove 37' is then removed.

Figure 1E:
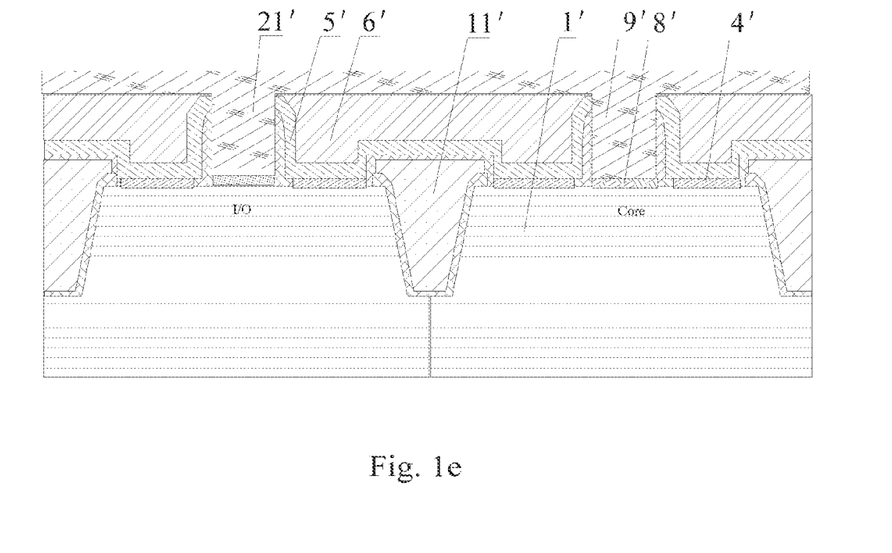

As shown in FIG. 1e, a layer of a material having a high dielectric constant and a metal gate 9' located on the layer with the material having a high dielectric constant are formed in the I/O gate groove 35' and the core gate groove 37'.

In the above semiconductor device fabricating method which combines a gate-last processing technology and a core gate dielectric forming technology, in order to avoid affecting the I/O oxide layer 21' when etching the core oxide layer 23', the I/O dummy gate 31' must first be shielded. Then the core dummy gate 33' is removed, after the removal of the core dummy gate, the core oxide layer 23' is removed to form the core gate groove 37'. Thereafter, the core gate dielectric layer 8' is formed on the substrate 1' in the core gate groove 37'. After the completion of the deposition of the core gate dielectric layer 8', the I/O dummy gate 31' is removed by shielding the core gate groove 37' to form an I/O gate groove with the I/O oxide layer retained.

Although this conventional fabricating method can avoid the I/O oxide layer from being affected when etching the core oxide layer, this method employs difficult and complicated technology steps to achieve that and hence has the drawback of a high manufacturing cost, which is not advantageous for large-scale fabrication.

BRIEF SUMMARY OF THE INVENTION

In order to overcome the shortcomings in the prior art, the present application provides a method for fabricating a semiconductor device that reduces the manufacturing steps of the gate-last process and thus lower the fabrication cost.

One embodiment of the present invention provides a method for fabricating a semiconductor device. The method may include the following steps: providing a substrate having a shallow trench isolation, a core oxide layer and an I/O oxide layer formed on the substrate and an I/O mask layer formed on the I/O oxide layer. The method also includes forming an input/output (I/O) dummy gate on the I/O mask layer and a core dummy gate on the core oxide layer, forming Lightly Doped Drain (LDD) regions on opposite sides of the I/O and core dummy gates using the dummy gates as a mask, forming spacers on side surfaces of the dummy gates, and forming a source region and a drain region adjacent to the spacers using the spacers and the dummy gates as a mask. The method further includes forming an NiSi layer on the substrate on opposite sides of the I/O dummy gate and the core dummy gate, depositing an etch barrier layer on the substrate covering the I/O dummy gate, the core dummy gate, the STI and the NiSi layer, and depositing a dielectric layer on the etch barrier layer. The method further includes planarizing the etch barrier layer and the dielectric layer to expose the top surface of the I/O dummy gate and the top surface of the core dummy gate, and simultaneously removing the I/O dummy gate and the core dummy gate to form a respective I/O gate groove and a core gate groove. The method additionally includes removing the core oxide layer located in the core gate groove, removing the I/O mask layer located in the I/O gate groove, forming a core gate dielectric layer on the substrate in the core gate groove, and forming a layer with a high dielectric constant (high-k) material in the I/O and core gate grooves and filling the I/O gate groove and the core gate groove with a metal layer.

In one embodiment, the step of forming the I/O dummy gate and the core dummy gate on the substrate may include: forming the an oxide layer on the substrate, forming a mask layer on the oxide layer, forming a mask photoresist layer on a first portion of the mask layer, removing a second portion of the mask layer which is not covered by the mask photoresist layer to expose a portion of the oxide layer, removing the mask photoresist layer, depositing a polysilicon layer on the substrate covering the exposed portion of the oxide layer and the first portion of the mask layer, patterning the polysilicon layer to form the I/O dummy gate on the first portion of the mask layer and the core dummy gate on the exposed portion of the oxide layer, removing a portion of the mask layer which is not covered by the I/O dummy gate to form the I/O mask layer, and removing portions of the oxide layer which are not covered by the I/O dummy gate and the core dummy gate to form the respective I/O oxide layer and core oxide layer.

In one embodiment, the step of forming the oxide layer on the substrate may include: forming a first oxide layer on the substrate, forming a first photoresist layer on a portion of the first oxide layer on which the I/O dummy gate is to be formed, removing a portion of the first oxide layer which is not covered by the first photoresist layer to expose the substrate, removing the first photoresist layer, and forming a second oxide layer on a portion of the substrate which is not covered by the first oxide layer. The second oxide layer has a thickness smaller than a thickness of the first oxide layer.

In one embodiment, the first oxide layer has a thickness of about 30 Å to 60 Å, the second oxide layer has a thickness of about 10 Å to 50 Å, and the mask layer has a thickness of about 20 Å to 50 Å.

In one embodiment, the core oxide layer may comprise a silicon oxide or a nitrogen oxide; and the I/O mask layer may comprise a titanium nitride.

In one embodiment, the core oxide layer may be formed by thermal oxidation, and the I/O mask layer may comprises a TiN material.

In one embodiment, an etching solution used in the step of etching to remove the core oxide layer located in the core gate groove is a diluted hydrofluoric acid having a dilution of water to hydrofluoric acid in a ratio of 100:1.

In one embodiment, an etching solution used during the process of etching to remove the I/O mask layer located in the I/O gate groove is a mixed solution of $NH_4OH$, $H_2O_2$ and $H_2O$ having a ratio of 1:(2-5):(30-200), and preferably in a ratio of 1:2:50. In one embodiment, the I/O mask layer may be removed at a temperature in a range from about 25° C. to about 60° C.

In one embodiment, the material of the etch barrier layer is selected from one of SiN, SiCN, SiC, SiON, or a combination thereof, and the material of the dielectric layer is an oxide or an insulating material having a low dielectric constant.

The method for fabricating a semiconductor device in the present invention is advantageous in that the I/O dummy gate and the core dummy gate can be simultaneously removed to form the respective I/O dummy gate groove and core dummy groove, and by forming the I/O mask layer between the I/O dummy gate and the I/O oxide layer, during the process of removing the core oxide layer, damages to the I/O oxide layer caused by the etching solution are avoided due to the presence of the I/O mask layer. Without the sequential steps of first removing the I/O dummy gate and then removing the core dummy gate in the conventional gate-last processing method, the present method greatly simplifies the fabrication steps and thus reduces the fabricating cost, which is advantageous to a large-scale fabrication.

Apart from the objects, features and advantages described above, the present application also has other objects, features and advantages. The present application will be further set forth in detail hereinafter with reference to the figures.

BRIEF DESCRIPTION OF THE DRAWINGS

The accompanying drawings, constituting a part of the specification and providing a further understanding of the present invention, show preferred embodiments of the present invention and explain the principle of the present invention together with the specification, in which.

DETAILED DESCRIPTION OF THE INVENTION

It should be noted that the terms used herein are merely used for describing specific embodiments, however, they should not be limited by the exemplary embodiments of the present application. For instance, a singular form used herein is also intended to include plural forms unless specifically indicated otherwise in the context. Besides, it also should be understood that when "comprise" and/or "include" is used in the present specification, it means that a feature, a step, an operation, a device, an assembly and/or a combination thereof is present in the concept of the present invention.

The term "on", "above", "upper", "vertical", "horizontal", "top", "bottom", "downwards", "upwards", etc. is used with reference to the orientation of the figures being described. Because elements of embodiments of the present invention can be positioned in different orientations, the term is used for purposes of illustration and is not limiting. For instance, if devices in a figure are upside down, a device described to be "above other device or structure" or "on other device or structure" later is located to be "below other device or structure" or "under other device or structure". Thus, the exemplary term "above" may mean "above" or "below" dependent from the orientation of the device.

Now, the exemplary embodiments according to the present application are described in detail in reference to the figures which are illustrative and not limiting. Those skilled in the art will appreciate that various modifications, additions and substitutions are possible, without departing from the scope and spirit of the invention as disclosed in the claims.

Figure 2A:
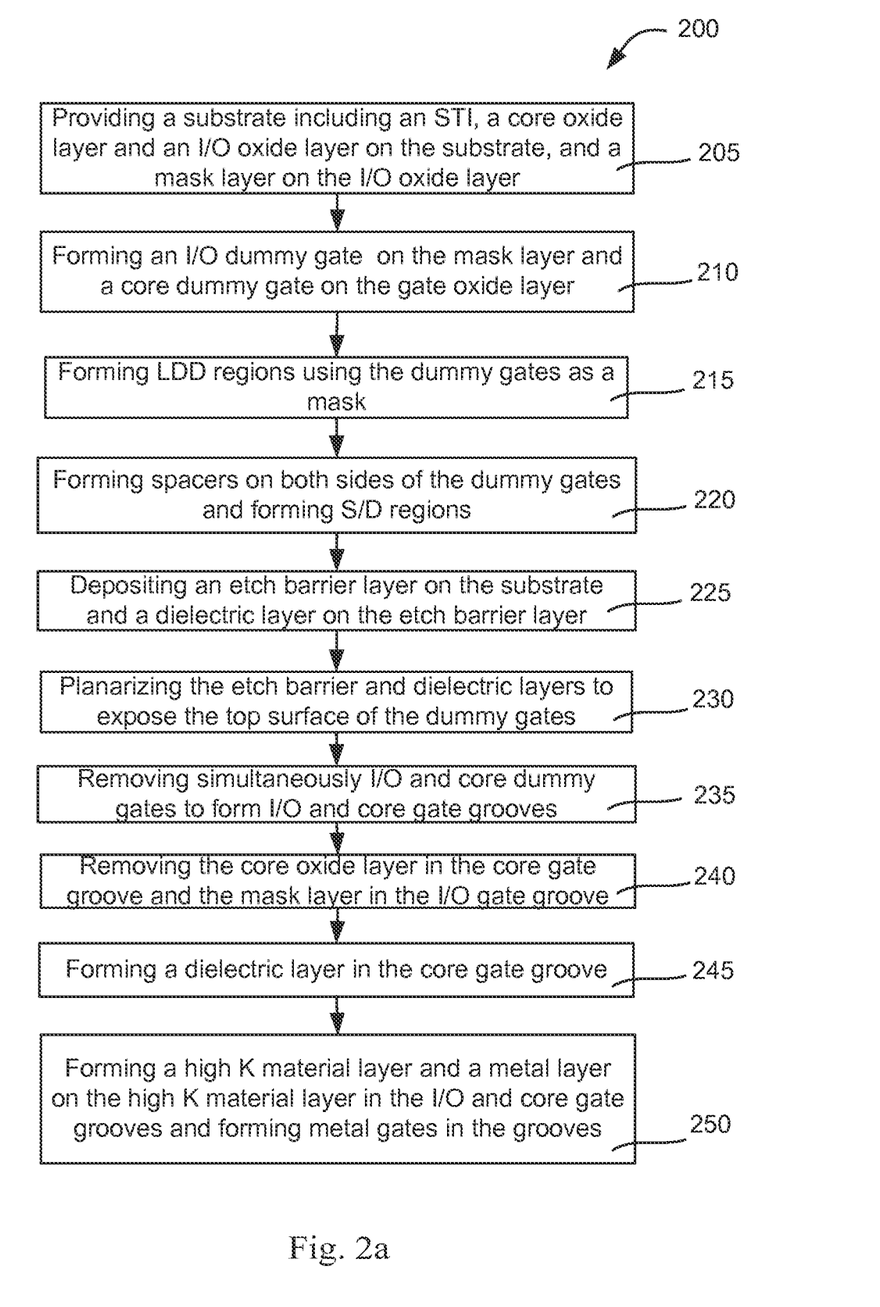
FIG. 2a is a flow chart of a method for fabricating a semiconductor device according to the present application.
Figure 2B:
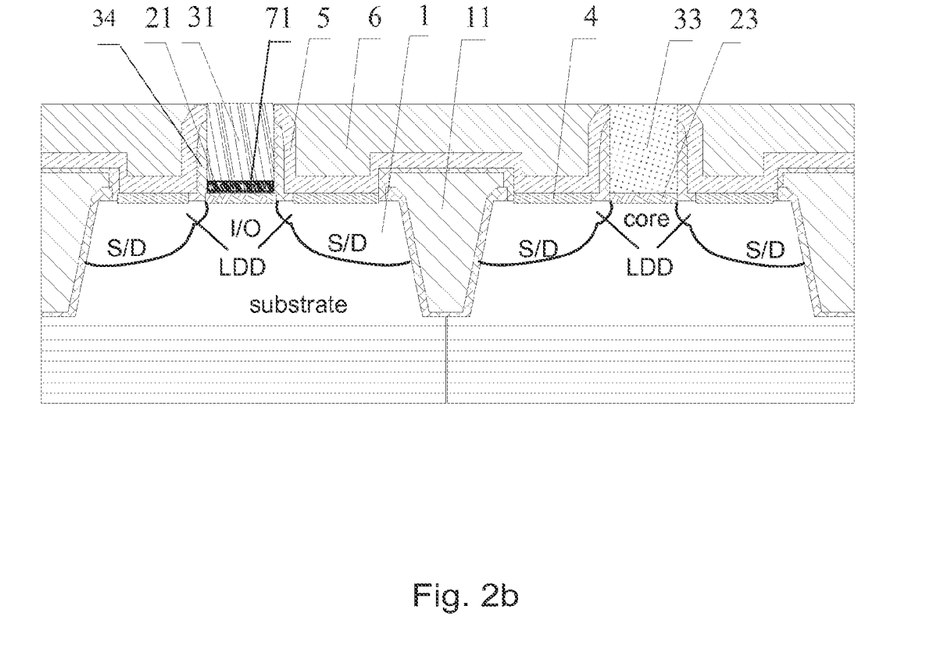
FIG. 2b is a schematic diagram illustrating a semiconductor device according to an embodiment of the present invention.

FIG. 2a is a flow chart of a method 200 for fabricating a semiconductor device according to an embodiment of the present invention. FIG. 2b is a schematic diagram illustrating a semiconductor device according to an embodiment of the present invention. FIGS. 3a through 3h are schematic diagrams illustrating a method for fabricating a semiconductor according to the embodiment.

As shown in FIG. 2a, the method may include the following steps:

Step 205: providing a substrate, the substrate may include a shallow trench isolation (STI) formed therein. The substrate may further include a core oxide layer 23 and an input/output (I/O) oxide layer 21 formed on the substrate. The core oxide layer and the I/O oxide layer are disposed on opposite sites of the STI. The substrate may include a mask layer 71 overlying the I/O oxide layer 21, as shown in FIG. 2b.

Step 210: forming an input/output (I/O) dummy gate 31 on the mask layer 71 and a core dummy gate 33 on the core oxide layer 23.

Step 215: forming lightly doped (LDD) regions on opposites sides of the I/O dummy gate and the core dummy gate using the I/O and core dummy gates as a mask.

Step 220: forming spacers 34 on both sides of the I/O and core dummy gates and forming source/drain regions on opposite sides of the dummy gates and adjacent to the spacers using the spacers and the dummy gates as a mask. After the formation of the source/drain regions, a nickel silicide layer 4 may be deposited on the substrate on opposites of the dummy gates and adjacent to the spacers.

Step 225: depositing an etch barrier layer 5 on the I/O dummy gate 31, the core dummy gate 33, the STI (shallow trench isolation region) 11 and the NiSi layer 4. Thereafter, a dielectric layer 6 is deposited on the etch barrier layer 5. In an embodiment, the etch barrier layer may be one of silicon nitride (SiN), silicon carbon nitride (SiCN), silicon carbide (SiC), and silicon oxynitride (SiON). The dielectric layer may include at least one of an oxide and/or an insulating material having a high dielectric constant.

Step 230: planarizing the etch barrier layer 5 and the dielectric layer 6 to expose the top surface of the I/O dummy gate 31 and the top surface of the core dummy gate 33. In a preferred embodiment, a CMP planarization process may be used, and the planarization process stops when the top surface of the planarized etch barrier layer 5 and dielectric layer 6 are flush with the top surface of the I/O dummy gate 31 and the core dummy gate 33.

Step 235: simultaneously removing the I/O dummy gate 31 and the core dummy gate 33 to form an I/O gate groove 35 and a core gate groove 37, respectively.

Step 240: removing the core oxide layer 23 located in the core gate groove 37, and removing the I/O mask layer 71 located in the I/O gate groove 35.

Step 245: forming a core gate dielectric layer 8 on the substrate in the core gate groove.

Step 250: forming on the I/O oxide layer 21 in the I/O gate groove 35 and on the core gate dielectric layer 8 in the core gate groove 37 a layer with the material having a high dielectric constant and forming a metal gate 9 on the high dielectric constant material layer disposed in the I/O groove and in the core gate groove.

The disclosed embodiment of the present invention provides a method that can geatly reduce the process steps in forming metal gates in both the I/O and core regions. By forming the I/O mask layer 71 between the I/O dummy gate 31 and the I/O oxide layer 21, during the process of etching to remove the core oxide layer 23 after the I/O dummy gate 31 and the core dummy gate 33 are simultaneously removed, damages to the I/O oxide layer 21 caused by the etching solution are avoided due to the presence of the I/O mask layer 71. The step of forming the metal gate 9 can be carried out following the removal of the I/O mask layer 71 after the removal of the core oxide layer 23. The method of the present invention is advantageous in that the I/O dummy gate 31 and the core dummy gate 33 can be simultaneously removed, thus, simplifies technology steps and reduces the fabricating cost, which is advantageous in a large-scale of industrial fabrication of semiconductor devices.

In an embodiment, the step of forming the I/O dummy gate 31 and the core dummy gate 33 on the substrate 1 may include: forming an oxide layer 2 on the substrate 1; forming a mask layer 7 on the oxide layer; forming a mask photoresist layer 73 on a portion of the mask layer 7 on which the I/O dummy gate 31 is to be formed; removing a portion of the mask layer 7 which is not covered by the mask photoresist layer 73 to expose a portion of the oxide layer 2; removing the mask photoresist layer 73; depositing a polysilicon layer on the mask layer and on the exposed oxide layer; patterning the polysilicon layer to form the I/O dummy gate 31 on a remaining portion of the mask layer 7 and the core dummy gate 33 on the exposed oxide layer 2; removing a portion of the mask layer 7 which is not covered by the I/O dummy gate 31 to form the I/O mask layer 71; and removing portions of the oxide layer 2 which are not covered by the I/O dummy gate 31 and the core dummy gate 33 to form the I/O oxide layer 21 and the core oxide layer 23.

In an embodiment of the present invention, the oxide layer may include a silicon oxide or a nitrogen oxide; the mask layer may include a titanium nitride material; and the gate dielectric layer may include a layer with a high dielectric constant (high-k) material.

In this embodiment, before the formation of the dummy gate, the mask layer 7 is formed on a portion of the oxide layer 2 on which the I/O dummy gate 31 is to be formed. At the same time of fabricating the dummy gate, the I/O mask layer 71 between the I/O dummy gate 31 and the I/O oxide layer 21 is formed. This process is simple and is easy to implement, and the formed I/O mask layer 71 matches the I/O dummy gate 31 in structure. After the removal of the I/O dummy gate, the I/O mask layer 71 is able to protect the I/O oxide layer 21, which helps to simplify the formation of the core gate dielectric layer in the gate-last processing technology of a semiconductor, simplify the fabrication process, and is advantageous to a large-scale production of semiconductor devices.

Preferably, in the above gate-last processing method of a semiconductor device, the step of forming the oxide layer 2 on the substrate 1 may include: forming a first oxide layer on the substrate 1; forming a first photoresist layer on a portion of the first oxide layer on which the I/O dummy gate 31 is to be formed; removing a portion of the first oxide layer which is not covered by the first photoresist layer to expose a portion of the substrate 1; removing the first photoresist layer, and forming a second oxide layer having a smaller thickness than the first oxide layer on a portion of the substrate 1 which is not covered by the first oxide layer.

In this embodiment, the step of forming the oxide layer 2 is divided into two parts, such that the first oxide layer has a different thickness than that of the second oxide layer, so as to achieve the object that the core oxide layer 23 has a smaller thickness than the thickness of the I/O oxide layer 21. In practice, to make the core oxide layer 23 have a smaller thickness than the I/O oxide layer 21 helps to reduce damages to the etch barrier layer 5 and the dielectric layer 6 caused by the etching solution during the process of etching the core oxide layer 23, while meeting the thickness requirements of the I/O oxide layer 21, so as to improve the quality of the semiconductor device fabricated.

Preferably, in the above gate-last processing method of a semiconductor device, the material of the first oxide layer 21 and the material of the second oxide layer 23 are the same or different. The first oxide layer 21 has a thickness of 30-60 Å, and the second oxide layer 23 has a thickness of 10-50 Å. In practice, the thickness of the mask layer can be set in accordance with the thickness of the second oxide layer 23 (viz. the thickness of the core oxide layer), in order to improve the protection of the I/O mask layer 71 for the I/O oxide layer 21. When the thickness of the second oxide layer is 10-50 Å, the thickness of the mask layer 7 is preferably 20-50 Å.

In a preferred embodiment, the core oxide layer 23 is formed by thermal oxidation, and the I/O mask layer 71 includes a TiN material. The oxide layer formed by thermal oxidation and the TiN material layer have a favourable etch selectivity ratio between them, and during the process of etching to remove the core oxide layer 23, the etching solution has small impact on the I/O mask layer 71, and the damage to the I/O mask layer 71 is small, which thereby can protect the I/O oxide layer 21.

In the above gate-last processing method of a semiconductor device in the present invention, any etching solution can be used in the step of etching to remove the core oxide layer 23 located in the core gate groove 37, as long as it can ensure that, during the process of etching the core oxide layer 23, the etching solution etches the I/O mask layer 71 in a relatively light manner, and will not damage the I/O oxide layer 21 below the I/O mask layer 71. In an embodiment, the etching solution is diluted hydrofluoric acid (DHF), preferably with a diluted hydrofluoric acid and water HF ($H_2O_2$): $H_2O$ in a ratio of 1:10 to 1:2000. This diluted hydrofluoric acid can be prepared, or directly use commercially available products. This diluted hydrofluoric acid has superior etching effect on the core oxide layer 23, especially when the core oxide layer 23 is formed by thermal oxidation, but has small damages to the mask layer, especially when the mask layer includes a TiN material. Furthermore, this diluted hydrofluoric acid causes small damages to the etch barrier layer and the dielectric layer during the process of etching the core oxide layer 23, which is advantageous to the quality of the semiconductor device fabricated.

In the above gate-last processing method of a semiconductor device in the present application, any etching solution can be used in the step of removing the I/O mask layer 71 located in the I/O gate groove 35, as long as it can ensure that, during the process of etching the I/O mask layer 71, the etching solution has small impact on the I/O oxide layer 21. The etching solution preferably used is a mixed solution (SCl) of $NH_4OH$, $H_2O_2$ and $H_2O$, wherein the molar ratio of $NH_4OH$, $H_2O_2$ and $H_2O$ in the mixed solution is 1:(2-5):(30-200), and the temperature is 25-60° C. Preferably, the molar ratio of $NH_4OH$, $H_2O_2$ and $H_2O$ in the mixed solution is 1:2:50. This SCl mixed solution has superior etching effect on the TiN material, and has weak corrosive effect on the I/O oxide layer, the etch barrier layer and the dielectric layer during the process of etching the TiN material, which is advantageous to the quality and performance of the semiconductor device fabricated.

Figure 3A:
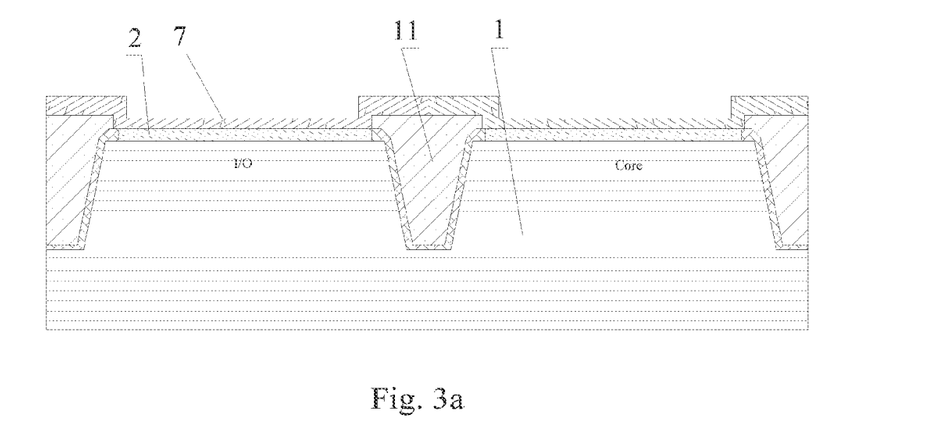
FIGS. 3a-3h are schematic diagrams illustrating a method for fabricating a semiconductor device according to an embodiment of the present invention.

FIGS. 3a through 3h are schematic diagrams illustrating a method for fabricating a semiconductor according to the embodiment shown in FIG. 2. As shown in FIG. 3a, multiple shallow trench isolation regions STI 11 for isolating an active region are formed in a substrate 1. After the formation of the STI regions, an oxide layer 2 is deposited on the surface of the substrate 1 between any two adjacent shallow trench isolation regions 11. After the deposition of the oxide layer 2, a mask layer 7 is deposited on the oxide layer 2 and the shallow trench isolation regions 11 to form a transition structure of the semiconductor device as shown in FIG. 3a. In an embodiment, the substrate 1 can be a monocrystalline, a polycrystalline silicon substrate, or a silicon on insulator, the oxide layer 2 may be formed by thermal oxidation and may have a thickness of about 25 Å. The mask layer 7 may be a TiN material layer having a thickness of about 30 Å.

Figure 3B:
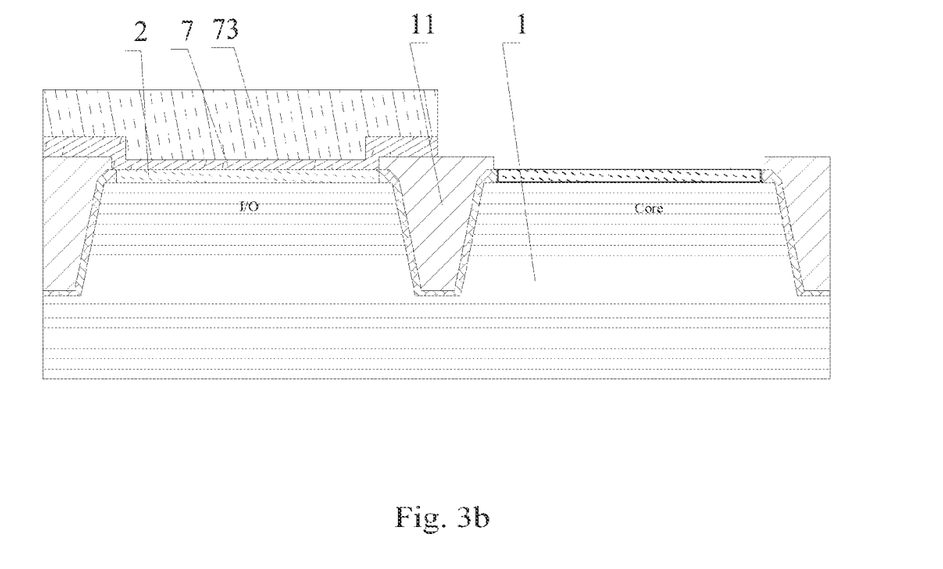

Referring to FIG. 3b, a mask photoresist layer 73 is deposited on a portion of the mask layer 7 on which an I/O dummy gate 31 is to be formed. A portion of the mask layer 7 which is not covered by the mask photoresist layer 73 is removed to expose a portion of the oxide layer 2, forming a transition structure of the semiconductor device as shown in FIG. 3b.

Figure 3C:
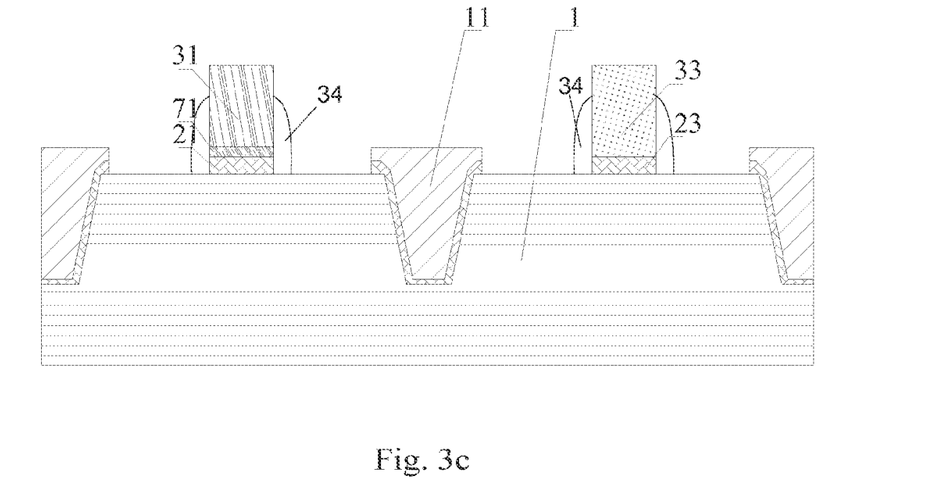

Referring to FIG. 3c, the mask photoresist layer 73 located on the mask layer 7 is removed, and a dummy gate material is deposited on the surface of the remaining portin of mask layer 7 and the exposed oxide layer 2, to form a dummy gate material layer. A first patterned photoresist layer is deposited on the surface of the dummy gate material layer for forming an I/O dummy gate 31 and a core dummy gate 33. The dummy gate material layer is etched using the first patterned photoresist layer as a mask to form a dummy gate structure comprising the I/O dummy gate 31 and the core dummy gate 33. The mask layer 7 is further etched downwardly using the I/O dummy gate 31 as a mask to form an I/O mask layer 71. The oxide layer 2 is further etched downwardly using the I/O dummy gate 31 and the core dummy gate 33 as a mask to form an I/O oxide layer 21 and a core oxide layer 23. FIG. 3c shows a transition structure of the semiconductor device after the completion of step 210 in FIG. 2a.

Thereafter, a first ion implantation may be performed using the I/O dummy gate and the core dummy gate as a mask for form lightly doped drain (LDD) regions on opposite sides of the I/O dummy gate 31 and core dummy gate 33. Spacers 34 will be formed on side surfaces of the I/O dummy gate 31 and the core dummy gate 33, and a second ion implantation will be performed on the substrate using the spacers and the I/O dummy gate 31 and the core dummy gate 33 as a mask to form a source region and a drain (step 220 in FIG. 2a).

A nickel silicide (NiSi) layer 4 is then deposited on the surface of the substrate that is free of the I/O dummy gate 31, the core dummy gate 33 and the shallow trench isolation region 11. An etch barrier layer 5 is deposited on the substrate covering the I/O dummy gate 31, the core dummy gate 33, the shallow trench isolation region STI 11 and the NiSi layer 4. In an embodiment, the material of the etch barrier layer 5 may include any one of SiN, SiCN, SiC and SiON or a combination thereof. The thickness of the etch barrier layer is about 50 Å to about 200 Å. The etch barrier layer 5 may be deposited by chemical vapor deposition or atomic layer deposition.

Figure 3D:
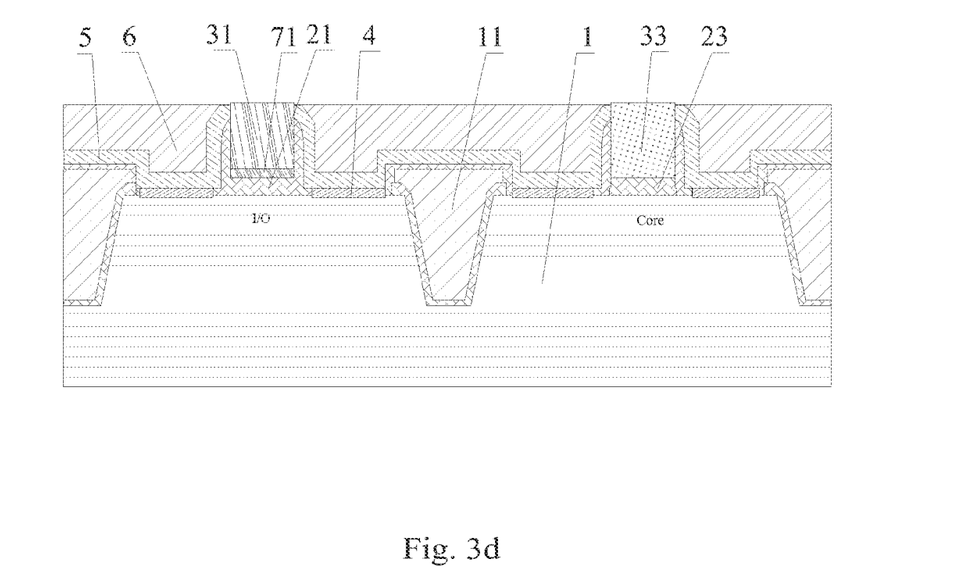

Thereafter, a dielectric layer 6 is deposited on the etch barrier layer 5. The dielectric layer 6 may include an oxide and/or an insulating material having a low dielectric constant, e.g., any one or a combination of polyoxyethylene (PEOX), plasma enhanced tetraethyl orthosilicate (PE-TEOS), and tetraethyl orthosilicate (SATEOS), as shown in step 225. At step 230, the etch barrier layer 5 and the dielectric layer 6 are then planarized by chemical mechanical polishing (CMP) to expose the top surface of the I/O dummy gate 31 and the core dummy gate 33 so that the upper surface of the etch barrier layer 5 and the dielectric layer 6 is flush with the top surface of the I/O dummy gate 31 and the core dummy gate 33, forming a semiconductor transition structure as shown in FIG. 3d. The dielectric layer 6 may be deposited by a chemical vapor deposition process, an atomic layer deposition process, or a spin coating process.

Figure 3E:
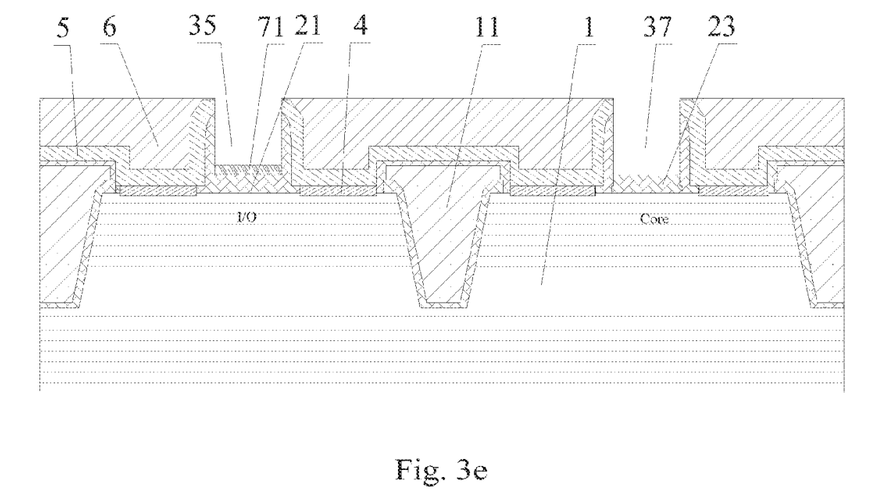

At step 235, the I/O dummy gate 31 and the core dummy gate 33 are simultaneously removed, so as to form an I/O gate groove 35 and a core gate groove 37. The I/O dummy gate 31 and the core dummy gate 33 may be removed by dry-etching or wet-etching, as shown in FIG. 3e.

Figure 3F:
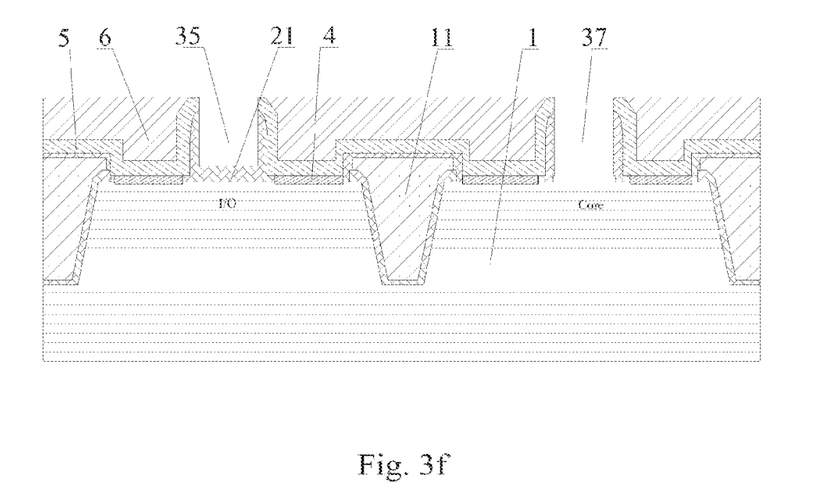

In an embodiment, diluted hydrofluoric acid DHF having a dilution ratio of water to hydrofluoric acid in a ratio of 100:1 is used as an etching solution to remove the core oxide layer 23 from the core gate groove 37, and an SC1 solution containing $NH_4OH$, $H_2O_2$ and $H_2O$ in a ratio of 1:2:50 is used as an etching solution to remove the I/O mask layer 71, forming a semiconductor transition structure as shown in FIG. 3f.

Figure 3G:
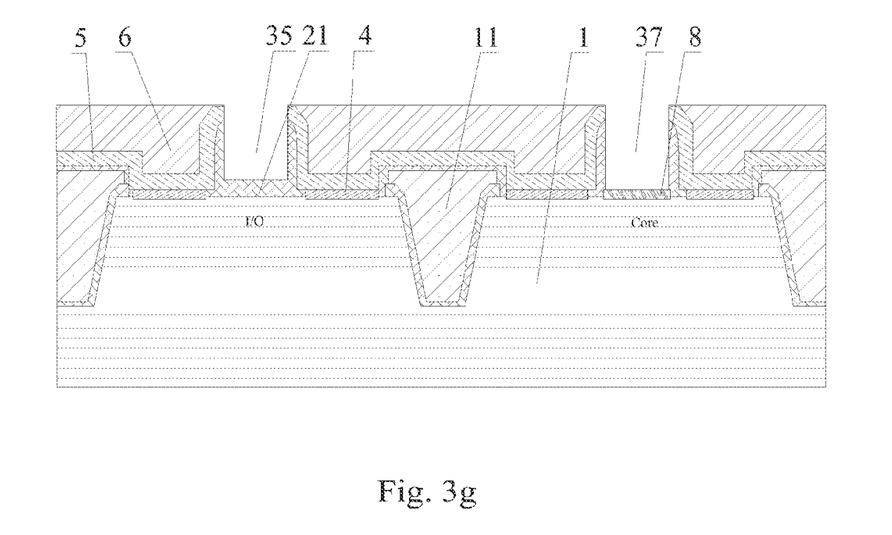

At step 245, a gate dielectric layer 8 is deposited in the core gate groove 37, forming a semiconductor transition structure as shown in FIG. 3g. The material which can be used for the core gate dielectric layer 8 is a material layer having a high dielectric constant. The deposition may be performed by an atomic layer deposition process.

Figure 3H:
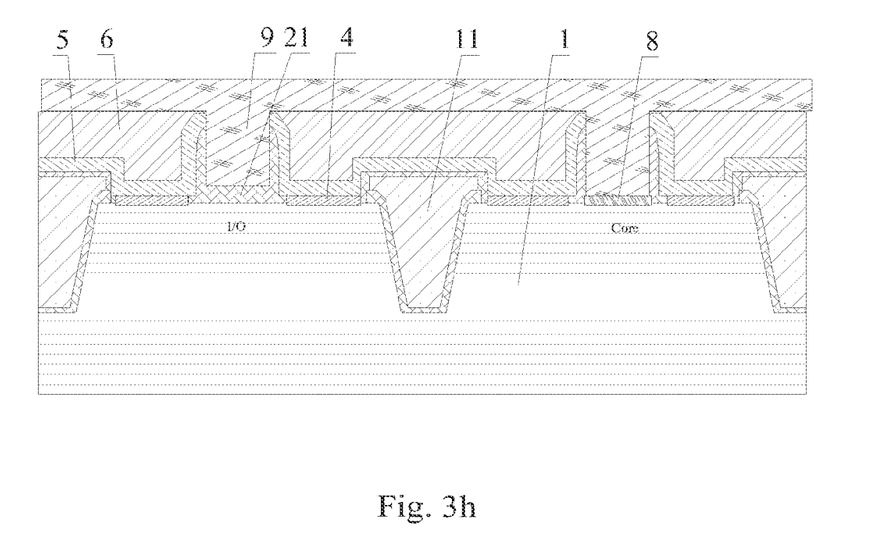

At step 250, a layer with a high dielectric constant material may be deposited in the core gate groove and in the I/O gate groove. A metal gate layer 9 is deposited on the substrate and fill the I/O gate groove 35 and the core gate groove 37, as shown in FIG. 3h. Subsequent fabricating processes of the semiconductor can employ known procedures to complete the semiconductor device.

In the above example embodiment, during the process of using diluted hydrofluoric acid DHF (100:1) to remove the core oxide layer 23 and using SC1 (1:2:50) as an etching solution to etch to remove the I/O mask layer 71, the impact of the etching solutions on the various materials is shown in Table 1.

TABLE 1

| Material layers | Diluted solutions | Etching thickness (Å/min) |
|---|---|---|
| core oxide layer (thermal oxidation material) | DHF (100:1) | 25.0 |
| I/O mask layer (TiN) | DHF (100:1) | 2.67 |
| I/O oxide layer (thermal oxidation material) | SC1 (1:2:50) | 0-0.5 |
| I/O mask layer (TiN) | SC1 (1:2:50) | 48.8 |

According to the data in Table 1, when the core oxide layer includes a material formed by thermal oxidation and the I/O mask layer includes a TiN material, a fast etching speed can be achieved when using a diluted hydrofluoric acid DHF as the etching solution to etch the core oxide layer, and small etching damages may be caused to the I/O mask layer, which effectively provides the protective effect of the I/O mask layer on the I/O oxide layer; and a fast etching speed can be achieved when using SC1 as the etching solution to etch the I/O mask layer, and substantially no damage is caused to the I/O oxide layer, which guarantees the performance of the semiconductor device fabricated.

As can be seen from the above example embodiment, in the gate-last processing method of a semiconductor device in the present invention, by forming the I/O mask layer 71 between the I/O dummy gate 31 and the I/O oxide layer 21, during the process of etching to remove the core oxide layer 23 after the I/O dummy gate 31 and the core dummy gate 33 are simultaneously removed, damages to the I/O oxide layer 21 caused by the etching solution are avoided due to the presence of the I/O mask layer 71. The step of forming the metal gate 9 can be carried out following the removal of the I/O mask layer 71 after the completion of the step of etching to remove the core oxide layer 23. Without the step of removing the I/O dummy gate 31 and then removing the core dummy gate 33 during the process of forming the gate dielectric layer 8 in the gate-last processing method of a semiconductor device can greatly simplify technology steps and thus, reduce the fabricating cost, which is advantageous to a large-scale fabrication of semiconductor devices.

It should be understood that embodiments of the present invention described herein are provided by way of example and are not intended to limit the present invention. Various alterations and changes to embodiments of the present invention are apparent to those skilled in the art. Any immaterial modifications, equivalent substitutions, improvements, etc. to embodiments of the invention are within the scope of the invention that is defined by the following claims.

What is claimed is:

1. A method for fabricating a semiconductor device, comprising:

providing a substrate having a shallow trench isolation (STI), with a core oxide layer and an input/output (I/O) oxide layer formed on the substrate and an I/O mask layer formed on the I/O oxide layer;

forming an I/O dummy gate on the I/O mask layer and a core dummy gate on the core oxide layer;

forming Lightly Doped Drain (LDD) regions on opposite sides of the I/O and core dummy gates using the I/O and core dummy gates as a mask;

forming spacers on side surfaces of the I/O and core dummy gates;

forming source and drain regions using the spacers and the dummy gates as a mask;

forming a nickel silicide (NiSi) layer on the substrate on opposite sides of the I/O dummy gate and the core dummy gate;

depositing an etch barrier layer on the substrate covering the I/O dummy gate, the core dummy gate, the STI and the NiSi layer;

depositing a dielectric layer on the etch barrier layer;

planarizing the etch barrier layer and the dielectric layer to expose a top surface of the I/O dummy gate and a top surface of the core dummy gate;

simultaneously removing the I/O dummy gate and the core dummy gate to form an I/O gate groove and a core gate groove;

removing the core oxide layer;

forming a gate dielectric layer on the substrate in the core gate groove; and forming a high-k dielectric layer in the I/O and core gate grooves; and forming a metal gate layer filling the I/O gate groove and the core gate groove.

2. The method according to claim 1, wherein the step of forming an I/O dummy gate and a core dummy gate on the substrate comprises:

forming an oxide layer on the substrate;
forming a mask layer on the oxide layer;
forming a mask photoresist layer on a first portion of the mask layer;
removing a second portion of the mask layer not being covered by the mask photoresist layer to expose a portion of the oxide layer;
removing the mask photoresist layer;
depositing a polysilicon layer on the substrate covering the exposed oxide layer and the first portion of the mask layer;
patterning the polysilicon layer to form the I/O dummy gate on the first portion of the mask layer and the core dummy gate on the exposed oxide layer;
removing a third portion of the I/O mask layer not covered by the I/O dummy gate; and
removing portions of the oxide layer not covered by the I/O dummy gate and the core dummy gate.

3. The method according to claim 2, wherein the step of forming the oxide layer on the substrate comprises:
forming a first oxide layer on the substrate;
forming a first photoresist layer on a portion of the first oxide layer on which the I/O dummy gate is to be formed;
removing a portion of the first oxide layer not covered by the first photoresist layer to expose the substrate; and
removing the first photoresist layer; and
forming a second oxide layer on a portion of the substrate which is not covered by the first oxide layer, the second oxide layer having a thickness smaller than a thickness of the first oxide layer.

4. The method according to claim 3, wherein the thickness of the first oxide layer is in a range between 30 Å and 60 Å, the thickness of the second oxide layer is in a range between 10 Å and 50 Å, and the mask layer has a thickness in a range between 20 Å and 50 Å.

5. The method according to claim 1, wherein the core oxide layer comprises a silicon oxide or a nitrogen oxide; and the I/O mask layer comprises a titanium nitride.

6. The method according to claim 5, wherein the core oxide layer is formed by thermal oxidation.

7. The method according to claim 6, wherein the step of removing the core oxide layer comprises a diluted hydrofluoric acid solution having a dilution ratio between water and hydrofluoric acid of 100:1.

8. The method according to claim 6, wherein the step of removing the I/O mask layer comprises a mixed solution of $NH_4OH$, $H_2O_2$ and $H_2O$ having a ratio of 1:(2-5):(30-200).

9. The method according to claim 8, wherein the ratio of the mixed solution of $NH_4OH$, $H_2O_2$ and $H_2O$ is 1:2:50.

10. The method according to claim 8, wherein the step of removing the I/O mask layer is performed at a temperature in a range between 25° C. and 60° C.

11. The method according to claim 1, wherein the etch barrier layer comprises one of SiN, SiCN, SiC, SiON or a combination thereof.

12. The method according to claim 1, wherein the dielectric layer comprises an oxide or an insulating material having a low dielectric constant.

13. The method according to claim 1, wherein the I/O dummy gate and the core dummy gate comprise a polysilicon material.

* * * * *